(12) United States Patent
Newton et al.

(10) Patent No.: US 7,625,099 B2
(45) Date of Patent: *Dec. 1, 2009

(54) LED LIGHTING ARRAY FOR A PORTABLE TASK LAMP

(75) Inventors: James Newton, Arlington, TX (US); Bijan Bayat, Plano, TX (US)

(73) Assignee: Bayco Products, Ltd., Wylie, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/967,842

(22) Filed: Dec. 31, 2007

(65) Prior Publication Data

US 2008/0144316 A1   Jun. 19, 2008

Related U.S. Application Data

(63) Continuation of application No. 10/730,600, filed on Dec. 8, 2003, now Pat. No. 7,334,918.

(60) Provisional application No. 60/468,551, filed on May 7, 2003.

(51) Int. Cl.
*F21V 1/00* (2006.01)

(52) U.S. Cl. ................ 362/238; 362/240

(58) Field of Classification Search ............ 362/249, 362/231, 252
See application file for complete search history.

(56) References Cited

U.S. PATENT DOCUMENTS 5,585,783 A * 12/1996 Hall ..................... 340/473
5,806,965 A * 9/1998 Deese .................... 362/249
6,220,722 B1 * 4/2001 Begemann ............... 362/231
6,450,663 B1 * 9/2002 Reinbach ................ 362/249
6,580,228 B1 * 6/2003 Chen et al. .............. 315/185 R
6,659,632 B2 * 12/2003 Chen ...................... 362/545

* cited by examiner

*Primary Examiner*—Ali Alavi
(74) *Attorney, Agent, or Firm*—Whitaker, Chalk, Swindle & Sawyer, LLP; Stephen S. Mosher (57) ABSTRACT

An LED lighting array is disclosed wherein a plurality of light emitting devices disposed in at least first and second columns are mounted on a planar mounting surface to form an emission plane. The emission axes of all the LEDs in a first column are parallel with each other and lie in a first plane. The emission axes of the LEDs in an adjacent, second column are also parallel, but a second plane containing the emission axes of the second column is disposed at a predetermined, non-zero angle with respect to the first plane. The non-zero angle is a function of the LED beam width and the distance to a lighting target. This configuration of the LEDs provides an optimum balance at a predetermined target distance between the size of the area illuminated and the brightness of the illumination of the target. In one aspect of the invention the LED lighting array includes at least first, second and third columns of LEDs. In another aspect of the invention an LED task light includes a transparent tube and an LED lighting array disposed within the tube. An electrical drive circuit associated with the mounting substrate within the tube provides pulsed direct current for driving the LED's.

6 Claims, 6 Drawing Sheets

LED LIGHTING ARRAY FOR A PORTABLE TASK LAMP

CROSS REFERENCE TO RELATED INVENTION

This application is a Continuation of U.S. patent application Ser. No. 10/730,600, filed Dec. 8, 2003 now U.S. Pat. No. 7,334,918 and entitled "LED Lighting Array for a Portable Task Lamp, which claims priority from U.S. Provisional Patent Application No. 60/468,551, filed May 7, 2003, entitled "LED Drive Circuit and Mounting Array For a Portable Task Light", by the same inventor.

BACKGROUND OF THE INVENTION

1. Field of the Invention

The present invention relates generally to the field of electrical lighting devices and, more specifically, to a portable task light which utilizes an array of light emitting devices such as light emitting diodes (LED's). The array of LEDs may be mounted on a printed circuit board disposed within a transparent or translucent tube.

2. Description of the Prior Art

There is often a need to enhance area illumination by using portable lighting products. The prior art devices used for this purpose include battery powered flashlights that have a limited life and a narrow focus; incandescent drop-lights that feature electrically inefficient, very hot and volatile tungsten filaments; and various types of fluorescent lights. Among the more popular light strips for a number of years have been of the fluorescent tube type strips which have found utility in a wide variety of applications. The fluorescent lighting strips also have disadvantages, however, in that a ballast must be included in the fixture. The ballast makes the light relatively large in size. More recently, various types of LED "strips" have been used as one type of array in endeavoring to provide an effective means to produce light with a minimum amount of heat. In certain of the prior art devices, an array of LED's is placed in various tubes or bulbs with reflectors for maximizing the light emitted. Standard light bulb bases have been used for connection to sockets and others have utilized couplings for attachment together forming a long lamp assembly.

There are a number of advantages to be obtained by providing a task or utility light in the form of a "strip" array which uses solid state LED's rather than a fluorescent tube and ballast. The use of LED's reduces power consumption to a bare minimum. Typical devices use on the order of 0.01 watts of power, making them extremely efficient. In determining the effectiveness of each type of illuminating device, a comparison is typically made of the efficiency of the light source in terms of the amount of light produced in relation to the amount of power consumed. This relationship can be used to calculate an "index" of relative efficiency. For general comparison, an incandescent light has an index of less than 24, a halogen lamp is only slightly better at 25, a mercury vapor is around 65 and a fluorescent lamp is in the neighborhood of 75, depending upon the type. By comparison, a light emitting diode (LED) in the T 1¾ style has a rating of almost 89.

Another advantage of the LED type strip lighting arrangement is that the LED strip is relatively cool to the touch. This allows LED type fixtures to be used in a host of user applications since they may be used safely around people and in close quarters. The LED type strip light also has a comparable useful life relative to other light sources. Yet another advantage of the LED type light strip is its small physical size. An LED arrangement can conveniently be packaged in the same or smaller size package as a fluorescent lamp with a comparable size bulb, since no ballast is required adjacent to the lamp. Further, since the light strip can use low voltage direct current power, the wiring is considerably smaller than that required in certain of the prior art devices.

LED strips also have the advantage of being extremely sturdy since the LED's are solidly mounted in a circuit board which in turn is held captive in a hollow thermoplastic tube This type of arrangement make the light extremely vibration and drop resistant. Further the tube can be plugged on each end as by end caps and sealed in such a manner as to make the invention waterproof for all practical purposes. These features make a strong and robust light strip compared to incandescent lamps that are subject to damage with vibration and fluorescent lamps that are fragile and often dangerous to handle.

Despite the various advantages offered by LED type light strips, various shortcomings remain. It would be advantageous to further reduce the size of the light assembly by eliminating the need for a transformer as a power source, either adjacent the strip or for placement on a wall near an electrical outlet.

Many of the prior art devices utilizing LED strips typically place the light sources side-by-side on a single plane or in various arrays that have failed to maximize the illuminative properties of the LED array. Prior art arrays generally are not adapted to varying their illumination patterns according to the target size or distance from the light source. In order to achieve the maximize beam disk flux efficiency at a selected task lamp distance.

The known prior art devices have also failed to take advantage of the benefits of driving the LED array with a pulsating direct current and have thus failed to maximize the LED intensity and the light output therefrom.

SUMMARY OF THE INVENTION

The present invention has as its object to overcome various of the shortcomings in the prior art described above. More specifically, the present invention has as its object to provide a portable task light employing a plurality of LEDs in an array which combines a novel off-axis orientation in the layout of the LEDs in the LED array with a pulsed current drive to maximize LED intensity. This combination provides a very compact, light weight task light and maximizes disk flux efficiencies at a selected task light target distance. The off-axis layout may be made adjustable in a variable emission formulation.

The LED task light assembly of the invention includes a rigid hollow tube having light transmitting characteristics. At least one planar mounting substrate is disposed within the tube contiguous with a hollow interior portion thereof. A plurality of LED's are mounted in columns on portions of the mounting substrate, establishing an emission plane. An electrical drive circuit associated with the mounting substrate within the tube provides pulsed direct current for driving the LED's. A pair of end caps enclose the planar mounting substrate within the tube.

In one preferred embodiment of the invention, the LEDs are mounted on the planar mounting surface to form an emission plane—array of LEDs disposed in columns and electrically coupled in series. The emission axes of all the LEDs in a first column are parallel with each other and lie in one plane. The emission axes of the LEDs in an adjacent, second column are also parallel, but the plane containing the emission axes of the second column is disposed at a predetermined, non-zero angle with respect to the plane of the first column. This orientation of the LEDs provides an optimum balance at a predetermined target distance between the size of the area illuminated and the brightness of the illumination of the target.

In another preferred embodiment of the invention, the LED's are mounted on the planar mounting surface in an adjustable emission plane which allows a user to vary the directivity and intensity of the array, thereby enabling a user to minimize exclusion zones and maximize illumination at selected target distances from the task light assembly. As used in this description, "exclusion zones" refers to zones of weak illumination upon an illuminated surface that occur when the illumination pattern of multiple emitters in an array includes voids between portions of the pattern's geometry at the surface being illuminated. Preferably, a portion of the LED's, e.g., one column of LEDs, are positioned on the planar mounting surface in a predetermined off-axis orientation which maximizes disk flux efficiency of light emission from the array of LED's at a selected task light target distance. As used in this description, "disk flux efficiency" refers to how efficiently and uniformly a light beam from an individual emitter or lamp having a circular cross-section, or of an array of such light beams from multiple emitters, illuminates a specified target object or zone at a given distance.

More specifically, a planar circuit board substrate can be provided within a hollow tube and having a top surface and a bottom surface and a thickness. A plurality of conductive traces are provided on the circuit board along with holes which penetrate the circuit board. One or more resistors are provided, each having a first wire lead and a second wire lead, the resistors being disposed on the top surface of the circuit board with the wire leads penetrating the board in communication with selected ones of the conductive traces. A plurality of LED's, each having an anode and a cathode terminating lead, are mounted on the top surface of the circuit board with the terminating leads penetrating the holes in the circuit board and communicating with selected ones of the conductive traces thereon. The LEDs may be electrically connected in series. A pair of end caps again enclose the circuit board within the tube. An electrical drive circuit mounted on the substrate provides a pulsating direct current for driving the LED's.

In one illustrative embodiment of the invention, the electrical drive circuit operates directly from an AC line voltage power input, rectified by a full-wave bridge rectifier, thereby supplying pulsating direct current, which maximizes forward current to the LED's. This circuit eliminates the need for an electrical transformer component.

In another illustrative embodiment of the invention, the electrical drive circuit operates from a DC power source, such as a 12 volt battery, and utilizes a DC-to-DC inverter circuit that includes a half-wave rectifier to provide the pulsating DC output to the array of LEDs.

In a preferred embodiment of the invention, the LED's are mounted on the top surface of the circuit board and a portion of the LEDs are mounted in an off-axis orientation which maximizes disk flux efficiency of light emission from the LED's at a selected task light distance. The off-axis mounting angle of the LED's on the top surface of the circuit board results in a reduction in the number of exclusionary zones produced by the light being emitted at the selected task light distance, thereby maximizing illumination at the selected target distance.

Additional objects, features and advantages will be apparent in the written description which follows.

DETAILED DESCRIPTION OF THE INVENTION

Figures 1, 2, 3:
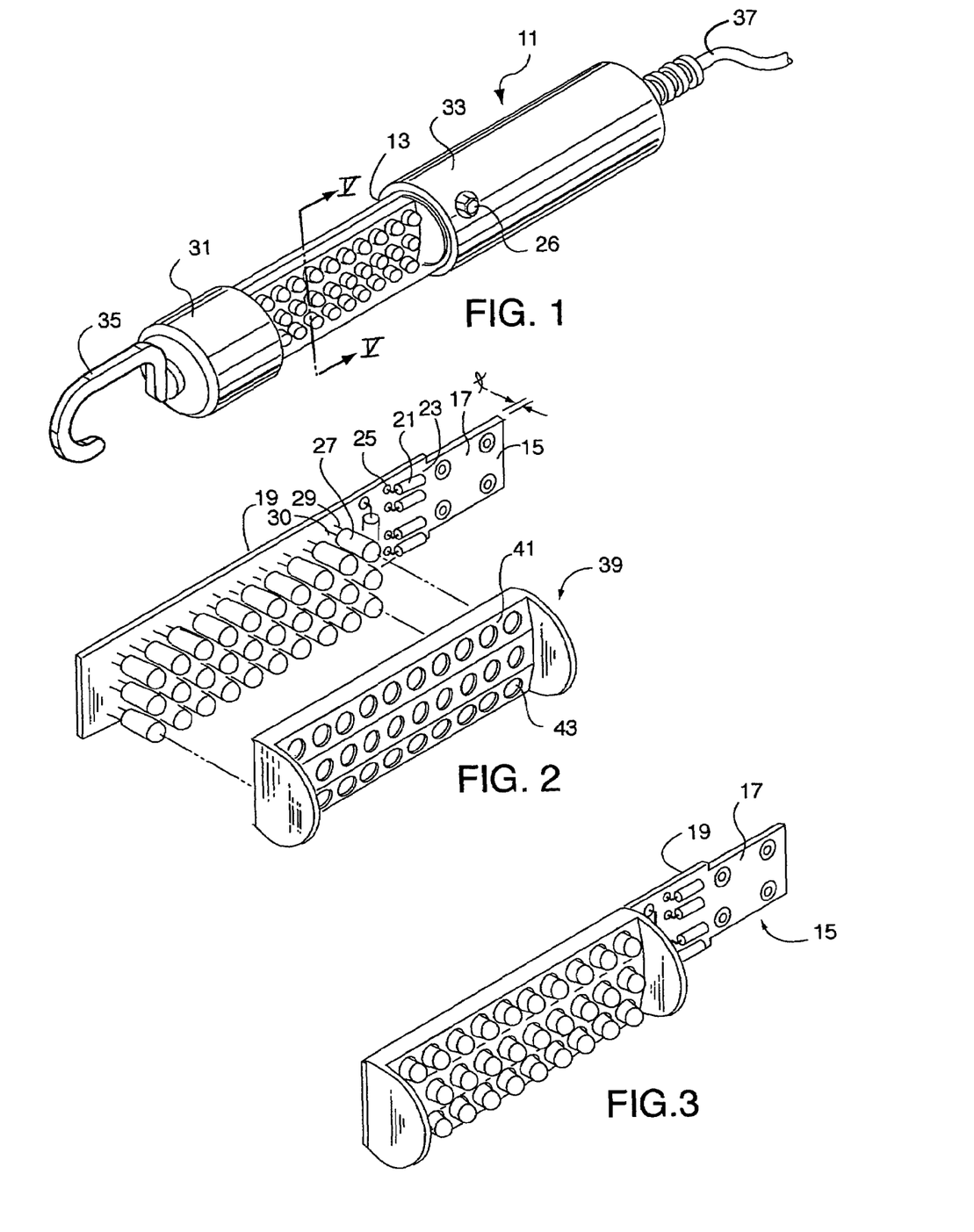
FIG. 1 is an isometric view of a preferred embodiment of an assembled LED task light according to the present invention.
FIG. 2 is a view of the circuit board used in the light of FIG. 1 showing an LED emission plane guide in exploded fashion for clarity.
FIG. 3 is a view similar to FIG. 2 but with the LED emission plane guide shown assembled on the circuit board.

Turning to FIG. 1, there is shown an LED task light assembly designated generally as 11. The task light assembly 11 includes a rigid hollow tube 13 (FIGS. 1 and 5) that is either transparent or translucent having appropriate light transmitting optical characteristics. The material of the hollow tube 13 is preferably a suitable plastic or acrylic commercially available formulation such as a rugged and optically clear polycarbonate, polyethylene, polypropylene or polyvinyl chloride. Acrylics or polycarbonates are found to be suitable materials as they are both transparent and basically rigid and have the structural integrity necessary for the application. The tube is cylindrically shaped and has a length which is selected based upon on its practical intended use. For example, in the case of a light having an overall length of about 10 inches, the tube can be about 3½ inches in length and about 1½ inches in diameter.

As shown in FIG. 1, the rigid hollow tube 13 has disposed therein a planar mounting substrate such as the circuit board 15. The printed circuit board 15 of thickness "t" is defined by an insulating substrate having a top surface 17 and a bottom surface 19. The planar circuit board 15 has a plurality of conductive traces thereon and holes there through, in conventional fashion. The material of the circuit board 15 is a dielectric substance well known in the art and commonly used in the industry. A pair of end caps 31, 33 isolate the printed circuit board 15 within the hollow tube 13. The end caps 31, 33 are cylindrically shaped and are formed of a suitable synthetic rubber, plastic or acrylic and may be held in place either by frictional engagement or with a suitable cement or adhesive to provide a waterproof joint to seal the hollow tube 13. End cap 31 is provided with a hook 35 which allows the task light to be conveniently mounted in a work location. The opposing end cap 33 is provided with a bore (not shown) in order to permit an electrical connection to be made between the circuit board 15 and the power cord 37. The power cord 37 is a conventional two conductor 18 AWG line cord. The cord 37 can be provided with a strain relief and sealed or potted with a compound, to prevent intrusion of water into the hollow tube.

In the particular example illustrated in FIG. 2, one or more resistors 21 are mounted on the top surface of the printed circuit board 15. Each resistor 21 has a first wire lead 23 and second wire lead 25, which penetrate the board through the holes provided therein, in communication with selected ones of the conductive traces. Both leads of the resistors are soldered to pads provided on the circuit board to provide an electrical connection and holding them securely in place.

In the illustrative examples disclosed herein the term LED refers to a light emitting diode. However, an LED could be any light emitting device capable of emitting light in the range of wavelengths visible to human eyesight or, in some applications, of emitting light in other wavelengths, such as infrared or ultraviolet. Typically, an LED or light emitting device includes a light emitter, a lens and a housing or body for support of the emitter and lens in an assembly. Examples of light emitters include but are not limited to semiconductor light emitting diodes or incandescent light emitting devices.

Light emitting devices as described herein are characterized by certain parameters. The beam of an LED is modeled as a cone-shaped solid figure with the apex at the LED light source and the base of the cone at the target or surface being illuminated. The angle of the sides of the cone at its apex form the emission angle, or total radiation angle, which defines the beam width or directivity of the light emitted by the LED. The line passing through the apex and the center of the cone's base is called the emission axis. If the target surface is flat and perpendicular to the emission axis, the base of the cone is a circle, as is the perpendicular cross-section of the cone anywhere along the axis. The arrays of LEDs described herein are composed of columns or rows of emitters. The words column or row may be used interchangeably since the choice is arbitrary. The surface or surfaces containing the apexes of the conical light beams from the emitters is called the emission plane of an array. The emission plane of the array of LEDs in the embodiments described herein may be a composite of several surfaces. Each column (or row) of LEDs is disposed on a separate surface, as will be described. The separate surfaces are joined together at a non-zero angle between the columns. The composite set of surfaces or planes containing the apexes of the emission beams is called the emission plane of the array.

The intensity of the light emitted from a light emitting device may not be uniform throughout the cross-section of the beam. In the case of the semiconductor diode LEDs used in the illustrative examples, the illumination intensity of the beam varies with the angle of the point being considered from the emission axis. The illumination pattern, e.g., of an individual LED is brightest within + or −14 degrees of the emission axis for the Nichia type NSPW510PS described herein, while its overall directivity or beam width is 50 degrees, i.e., + or −25 degrees. The pattern of illumination provided by the brightest portion of the illumination pattern (within the + or −14 degrees) is called the illumination disk, defined at the illumination target, in the description which follows. Further, each LED of an array of LEDs produces a conical beam of light. Conical beams from adjacent LEDs intersect at a primary intersection if the LEDs producing the beams are relatively close together and have their emission axes directed within an angle of one-half beam width or less. Conical beams from two LEDs that are not adjacent—i.e., another LED emitting a beam is positioned between them—intersect at a secondary intersection.

In FIG. 2, a plurality of LEDs 27 each having an anode and a cathode terminating lead (29, 30 in FIG. 2) are mounted in columns on the top surface 17 of the circuit board 15 with the terminating leads 29, 30 penetrating the holes in the circuit board and communicating with selected ones of the conductive traces thereon. In this illustrative example the LEDs are electrically connected in series but could be connected in series-parallel or parallel configurations, depending on the application. There are many and varied types of semiconductor diode LEDs 27 that are commercially available and may be employed for purposes of the present invention. For example, the particular LEDs utilized in the illustrated embodiment are a 5 mm diameter, white LED having a 50 degree directivity (beam width), model NSPN510PS, manufactured by Nichia Corporation, Japan.

As shown in FIGS. 2 and 3, the embodiment of the task light shown also includes a clear acrylic emission plane guide 39. The emission plane guide 39 includes a slightly arcuate upper surface 41 which is provided with a plurality of openings 43 in a predetermined arrangement and angular orientation for receiving and aligning the LEDS 27. FIG. 2 shows the emission plane guide 39 separated in exploded fashion from the circuit board 15, while FIG. 3 shows the emission plane guide 39 in place over the circuit board 15. As will be explained in greater detail herein below, the emission plane guide 39 configures the emission plane of the array of LEDs 27 by aligning the LED columns in an off-axis orientation. This orientation of the LED columns with respect to each other maximizes the disk flux of light emission from the LEDs at a selected task light target distance. In the case of a utility light sold for automotive repair, for example, the selected task light target distance is generally on the order of two meters.

The effect of orienting the emission axes of the LED columns at an angle with respect to each other was discovered during experiments with various LED arrays. These experiments sought an array that provided the brightest, most uniform illumination of a target surface with a given array of LEDs that provided the amount of illumination needed for the application being considered. It was further discovered that the orientation angle, called the off-axis orientation angle, bore a certain relationship with the beam width of the individual LED devices utilized to form the array. This off-axis orientation angle defined the emission plane of the array of several columns of LEDs of the present invention as will be described herein below.

Figure 4A:
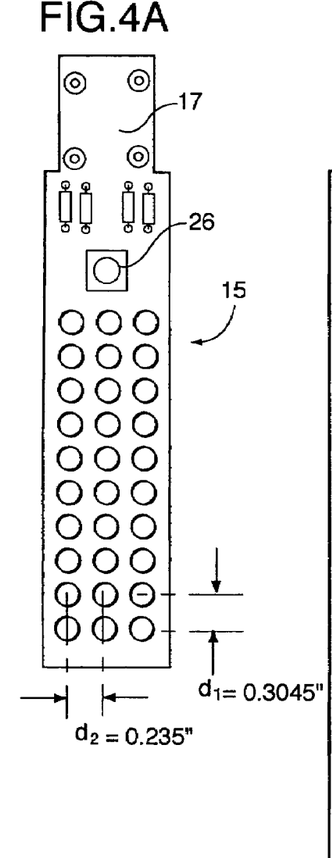
FIG. 4A is a top view of one embodiment of the LED task light according to the present invention using a 30 LED circuit board.
Figure 4B:
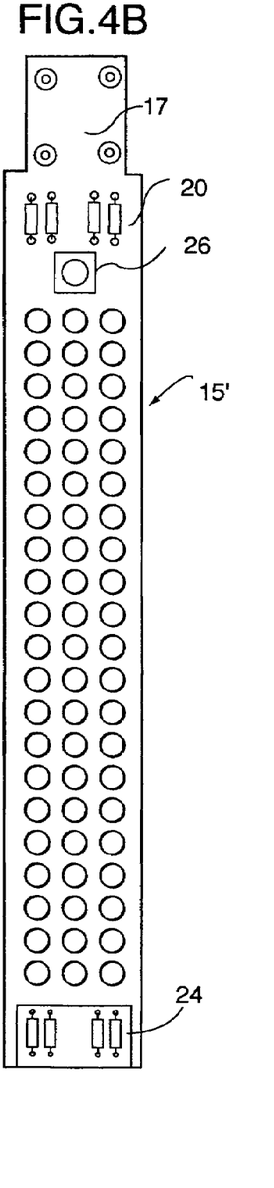
FIG. 4B is a top view of another embodiment of the LED task light according to the present invention using a 60 LED circuit board.

FIGS. 4A and 4B show two embodiments of the circuit board of the present invention. In FIG. 4A, the LED array includes three ordered columns of ten LEDs each. The body diameter of each LED in this example is 5.00 mm. In FIG. 4A, a three by ten array or matrix (three LED's per row by ten LED's per column) is formed on the top surface 17 of the circuit board 15. In FIG. 4B the LED array includes three ordered columns of 20 LEDs in each column. Each column of LEDs is disposed along and thus defines an LED axis. In the example shown in FIG. 4A, the centerline spacing, d2, between columns of the LED's is 0.235 inches (or, about 6.0 mm) and the spacing d1, between LEDs in each column is 0.305 inches (or, about 7.75 mm). The dimensions d1 and d2 may be determined empirically by considering such factors as (a) the size of the emission plane (i.e., the circuit board 15); (b) the number of light emitting devices (LEDs); (c) the nominal beam emission angles; and (d) the primary (i.e., first) beam intersections of the inclined LED emitters between the emission plane 15 and the target surface as a function of the target distance, T.

For example, in the illustrative embodiment of FIGS. 1 through 4A, the space available in the tubular body of the lamp requires that the LEDs be close together but not touching. Further, given the beam incidence and emission angles of the LEDs selected for the array, the columns and rows are spaced to achieve the desired overlap—i.e., the desired beam intersections—at the target distance for the intended application. The numbers provided herein for d1 and d2 are the result of this procedure.

Other arrangements are also possible. The array of LEDs may consist of columns or rows of LEDs arranged in straight or curved lines. For example, many lamps in use today are round, or oval, or rectangular, etc. The small size of LEDs facilitates a variety of shapes and configurations adapted to numerous applications in industrial, scientific or medical, military, automotive, residential and consumer uses. Further, the accompanying circuitry can be compactly arranged to fit the LED configuration to maximum advantage. For example, in the arrangement illustrated in FIG. 4B, the resistor sets 20 and 24 may be located on opposite ends of the LED array in order to better dissipate heat. Note also in FIGS. 4A and 4B the inclusion of an on/off switch 26. In some embodiments, the rectifier diodes may be individual components or packaged as a single unit.

Figure 5:
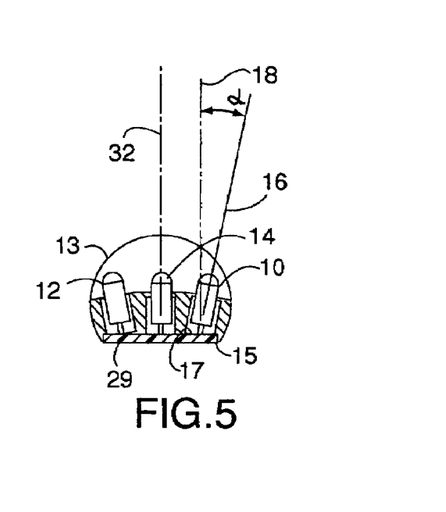
FIG. 5 is a cross-sectional view taken along lines V-V of FIG. 1.

Referring to FIG. 5, there is illustrated a preferred embodiment of the present invention wherein the emission axes of the side columns of LEDs are inclined at an angle α with respect to the emission axes of the center column of LEDs. The present invention, as described herein above for the illustrative task light, combines a novel "off-axis emission formulation" (or, off-axis emission configuration) in the layout of the LED array together with a pulsating forward current to maximize LED intensity. This configuration maximizes the target disk flux efficiency at the selected task light-to-target distance of 2.0 meters. In FIG. 5, three LEDs making up one row of the LED array, i.e., one LED from each column, are mounted on the top surface 17 of the circuit board 15 and oriented in an "off-axis" fashion. That is, LEDs 10 and 12, corresponding to the end LEDs of the respective side columns of LEDs, are mounted with their respective central axes 16 at an angle α, which is approximately 12.5, offset from a line 18 through LED 14 drawn perpendicular to the top surface 17 of the circuit board 15 and parallel to the emission axis 32 of LED 14. By comparison, the center diode 14 has a central axis 20 which is perpendicular to the top surface of the circuit board. The off-axis mounting of LEDs 10 and 12 on the top surface of the circuit board, that is, wherein LEDs 10 and 12 are oriented along axes aligned away from the axis of LED 14 by the 12.5 degree angle α, results in a reduction in the number of exclusionary zones produced by the light being emitted at the selected task light-to-target distance, thereby maximizing illumination at a selected target distance.

The 12.5 degree off-axis angle α of the side columns of LEDS in the array shown in FIG. 5 was developed experimentally. Further experimentation showed that the off-axis angle α, for a target distance of 2.0 meters, is approximately one-quarter of the emission beam width of the LED emitters used in the array. This relationship holds for emitters of this type, for a range of array-to-target distances, from less than a meter to several meters. The relationship is expressed as the angle α=½ (beam width/target distance). In this example, where the beam width of an LED and the target distance is 2.0 meters, α=½(50/2.0)=12.5 degrees. At 1.0 meter, for the same LED, would be 25 degrees. For an LED having a bean width of, e.g., 60 degrees and a target distance of 3.0 meters, the angle is α=½(60/3.0)=10 degrees, and so on. Thus, a designer can predictably configure an array of LED emitters for a task light for a particular application, to provide an optimum balance of high average brightness and the size of the illuminated area at the target distance. Such a balance enables maximum utility from a minimum of emitters, thereby minimizing manufacturing and energy costs in producing and utilizing lighting products, portable or fixed, employing arrays of LED elements.

Figure 6:
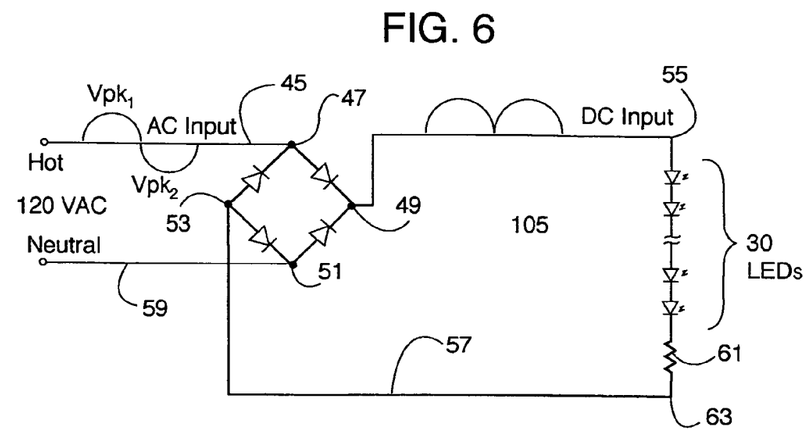
FIG. 6 is a circuit diagram of one embodiment of an electrical drive circuit used to provide pulsed current to the LED's mounted on the circuit board.
Figure 7:
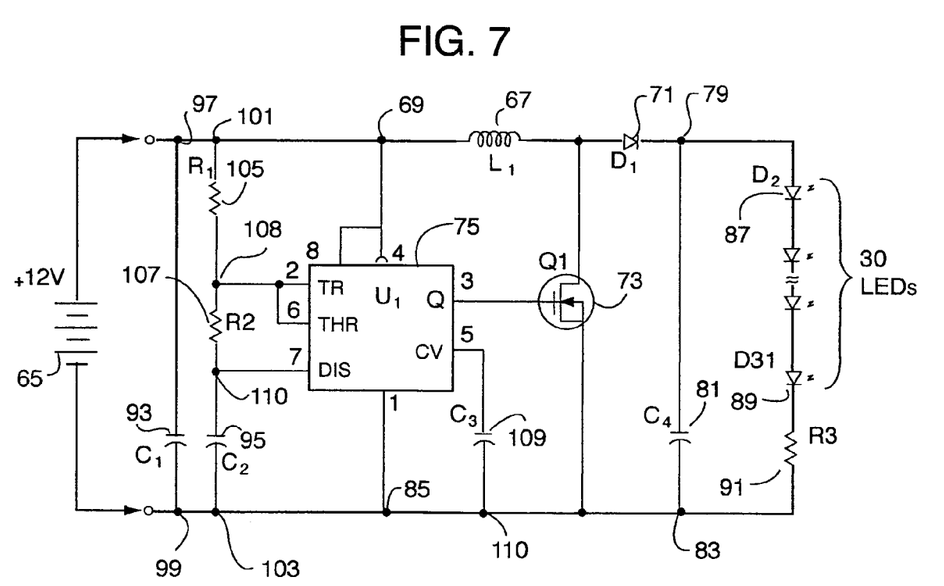
FIG. 7 is a circuit diagram of another embodiment of an electrical drive circuit used to provide pulsed current to the LEDs.

Referring to FIGS. 6 and 7, two embodiments of an electrical drive circuit are shown. The electrical drive circuit provides a pulsating direct current for driving the LEDs. The electrical drive circuit of either type may be carried on the circuit board 15. Referring first to FIG. 6, a 115 volt alternating current line input illustrated by the full sine wave in line 45 is fed to a solid state, full-wave bridge rectifier where it is rectified into a full wave pulsating D.C. output. The bridge is comprised of diodes D1-D4 interconnected by the nodes 47, 49, 51, 53. The output at node 49 is connected to a string of 30 LED's connected in series at a node 55. The cathode of the last diode in the series is connected to a current setting resistor 61. Resistor 61 is connected at its opposite lead to node 63. Node 63 connects to node 53 of the bridge circuit by means of line 57. The resistor 61 limits the forward current for the circuit depending upon the value chosen. The example shown uses a 975 Ohm resistor, obtained by paralleling four 3900 Ohm resistors. These individual, lower wattage resistors are mounted with enough space between them to spread out the dissipation of heat to avoid hot spots within the task light.

The circuit of FIGS. 6 and 7 exploit the higher luminosity of the LEDs when operated in the pulsed mode and the relatively long persistence of the human eye to maximize the apparent light output of the task light without exceeding the maximum continuous ratings of the LEDs. In the illustrative example shown, peak voltage across the LED string reaches approximately 120 volts, driven by the full peak value of the rectified voltage of approximately 170 volts across the LEDs and 975 Ohm resistor in series when biased ON in the forward direction. Considering the square-law characteristic of the LEDs, if the circuit voltage changes by 6 volts, corresponding to a change of approximately 0.2 volt across each LED (i.e., a 5% change), the resulting current change is approximately 50%. Also, the circuit is conducting for about 90 to 100° out of 180° resulting in a 50 to 55% duty cycle. In this example a 975 ohm resistor limits the current through the LEDs, e.g., to approximately Ipeak=40 milliamps of forward current. The voltage drop Vpeak across resistor 61 in the example shown is approximately 40 volts at Ipeak=40 milliamps. For the LEDs in this example, where Ipeak=40 milliamps (the value of the pulsed current from the full-wave bridge rectifier) and a duty ratio of 50%, the LED voltage drop Vpeak for each LED is approximately 4.0 volts and the corresponding peak luminosity is about 2× the nominal value at the rated continuous current of 20 milliamps.

Referring to FIG. 7, there is shown another embodiment of the electrical drive circuit of the invention, a DC converter, which utilizes a 12 volt direct current line input from a suitable source 65, such as a battery, that is connected to node 97.

An inductor 67 is connected between nodes 69, 71. A transistor 73 is connected between nodes 71 on one side and nodes 83 and 110 on an opposite side. In this example, the gate of MOSFET transistor 73 is connected to pin 3 of an integrated circuit (IC) 75 which acts as a duty cycle modulator, as will be explained. The anode of a 2 amp/400 volt rectifier diode 77 is also connected to node 71 and the cathode is connected to a node 79. A capacitor 81 is connected between the node 79 and a node 83. The duty cycle modulator IC 75 is connected between nodes 69 and 85 and provides an output timing pulse to the gate 72 of the MOSFET transistor 73. In this example, a series of 30 LEDs 87 are coupled between the node 79 and the anode of a diode 89. A current limiting resistor 91 is connected between the cathode of the diode 89 and a node 83. The circuit also includes capacitors 93, 95 mounted between nodes 97, 99 and 110, 103, respectively. Two fixed resistors 105, 107, connected together at node 108, are connected in series between nodes 101 and 110. Nodes 108, 110 respectively connect the leads of resistor 107 to pins 2, 6 (connected together) and 7 of the IC 75, as shown. Pins 4 and 8 of the IC are connected to node 69 while pin 1 connects to node 85. A capacitor 109 is connected between node 100 and pin 5 of the IC 75.

In operation, the duty cycle modulator 75 acts as a timing circuit and periodically switches the MOSFET transistor 73 on and off according to the RC time constant provided by the resistor 107 and capacitor 95. As the MOSFET transistor 73 is switched on, current flows through the inductor 67, charging the magnetic field in the inductor as the current increases. When the MOSFET transistor 73 is switched off, the magnetic field collapses, charging capacitor 81 via rectifier diode 77 to a peak value of approximately 170 volts. This positive voltage pulse appears at the node 71. The periodic switching of transistor 73 causes a string of pulses to appear at node 71. The current limiting resistor 91 is coupled in series with the LEDs to limit the forward current through the LEDs 87.

Figure 8:
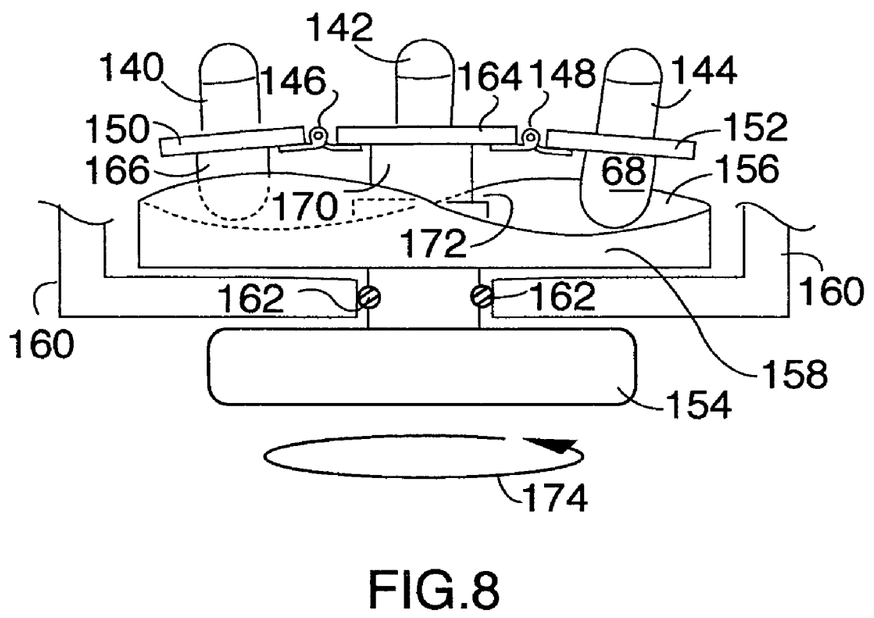
FIG. 8 is a simplified, partial cross-sectional view of an adjustable emission plane used in one embodiment of the LED task light according to the present invention.

Referring to FIG. 8, illustrating another embodiment of the invention, it will be recalled that, in the embodiment of the invention illustrated in FIGS. 2 and 3, the emission plane is "fixed" by means of the emission plane guide 39. FIG. 8 shows a cross-section view of an illustrative embodiment of the invention in which the emission plane is user-variable. The individual substrates 150, 164 and 152, of three columns of LED's 140, 142 and 144 respectively, are connected by hinges 146, 148. The outer columns are shown biased in a downward position. A knob element 154, coupled with a cam 156 that includes a contoured surface 158 as the cam profile, can be grasped by a user. It will be appreciated that the cam 156 is shown in FIG. 8 in a perspective view; the rest of the structure illustrated in FIG. 8 is shown in a cross-section view. A bearing surface 172 extending above the center of the contoured surface 158 of the cam 156 contacts the bottom of a spacer 170 to maintain the center column of LEDs 142 fixed with respect to the task light housing, which includes a substrate frame 160, partially shown in FIG. 8. Rotational movement of the knob element 54, represented by the arrow 174, causes the contoured surface 158 to rotate, moving the cam followers 166, 168 upward or downward to vary the angular orientation of the outer LED columns 140, 144 relative to the center column 142.

Continuing with FIG. 8, the profile of the contoured surface 158 may be varied to provide the amount of vertical movement of the respective substrates 150, 152. In the embodiment shown, the profile resembles a rotating wave, whereby each point on the contoured surface 158 traverses a sinusoid curve in amplitude (in the vertical direction) with each complete rotation of the cam 156. In this way, the LED's are mounted in an adjustable emission plane, which allows a user to vary the directivity and intensity of the array, to minimize exclusion zones and maximize illumination at a selected target distance of the task light assembly. If desired, the knob 154 can also be movable between "preset" detents (not shown) which vary the angular orientation of the emission plane elements between certain preselected user-friendly arrangements. For example, there could be presets for close range work, distant range work, narrow area illumination, broad area illumination, etc. Other variations of the variable emission plane embodiment may include a single flexible substrate (not shown in FIG. 8) supporting all columns or rows of LED emitters. In this variation, the portion of the substrate supporting the center column or row 142 is held fixed relative to the frame 160 with the adjacent side columns or rows 140, 144 free to flex upward or downward as the knob 154 is rotated. Further, the side rows or columns 140, 144 may be biased to a nominal median position at the predetermined non-zero angle—e.g., the one quarter beam width angle—so that the knob 154 provides approximately equal variation in the non-zero angle throughout its rotation.

Figure 9:
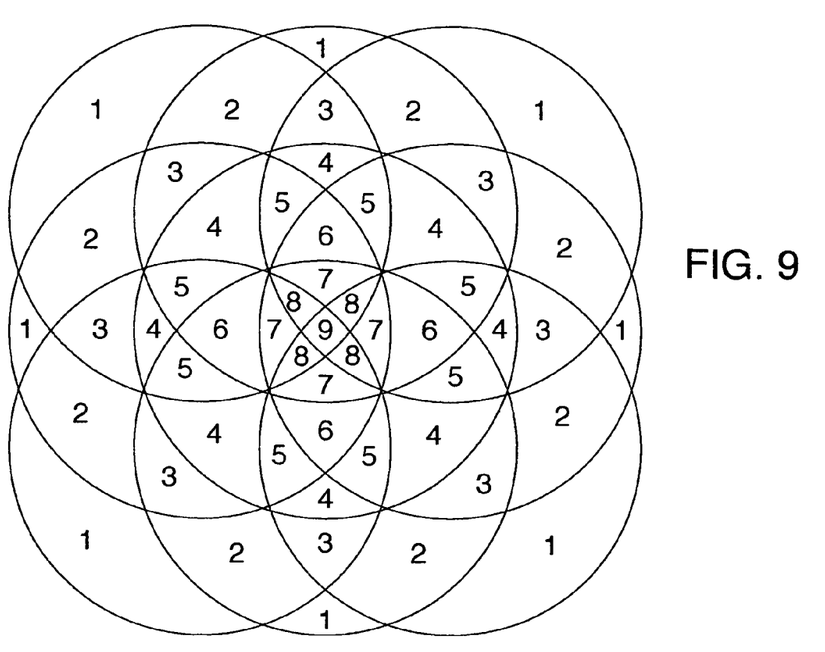
FIG. 9 illustrates an illumination pattern on a target surface at a 2.0 meter target distance of one embodiment of a 3×3 array of LEDs according to the present invention.

A result of the "off-axis emission formulation" of the present invention is illustrated by the illumination pattern on a flat target surface shown in FIG. 9 where the disk flux efficiency is maximized at a selected target distance. For example, the "selected target distance" for a utility task light may be two meters, a convenient distance for a task lamp hung in or near the engine compartment of a vehicle during maintenance and repair operations. In the illustrative example of a 3×10 array of LEDS of FIG. 4A having the centerline spacings of d1=0.305 in one direction and d2=0.235 in another direction, the emitter axis offset angle α in FIG. 5 is optimized at approximately 12.5°. This arrangement maximizes illumination at the target distance by relating emission angles of the array to the target distance, as described herein above. By angularly spreading out, i.e., "triangulating" the beams, it is possible to maximize the use of light at a selected target distance which, in this case, is two meters. The desired axis offset angle can be calculated mathematically from the specified beam width of the selected LED emitter used, as will be apparent in the following discussion.

In the context of task lighting, an illuminated area at a distance from the user has commonly been referred to as the "disk" or, the "spot." Emitter light output is typically measured in amounts of luminous flux falling on a surface per unit area (measured in lumens), related via the inverse square law to the emission output luminous intensity (measured in watts-per-steradian). Heretofore, prior art devices, especially LED devices, in the field of arrays of multiple-emitter light sources, have not adequately addressed the question of spot or disk efficiencies, resulting in problems of too much light on a target or too little light on a12 target. These deficiencies tend to waste the available light, or fail to take proper advantage of the available light.

Figure 10:
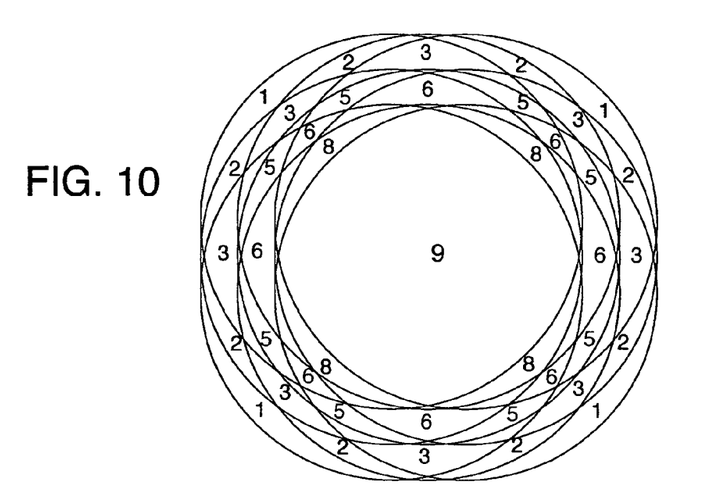
FIG. 10. Illustrates an illumination pattern on a target surface at a 2.0 meter target distance of one embodiment of a 3×3 array of LEDs showing a more tightly bunched disk pattern than the pattern of FIG. 9.
Figure 11:
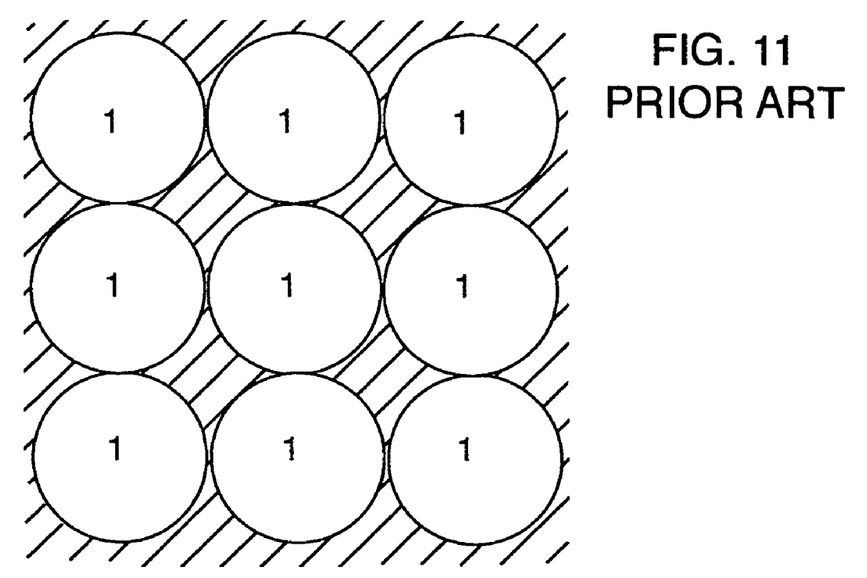
FIG. 11 illustrates an illumination pattern on a target surface at a 2.0 meter target distance of a prior art 3×3 array of LEDs.
Figure 12:
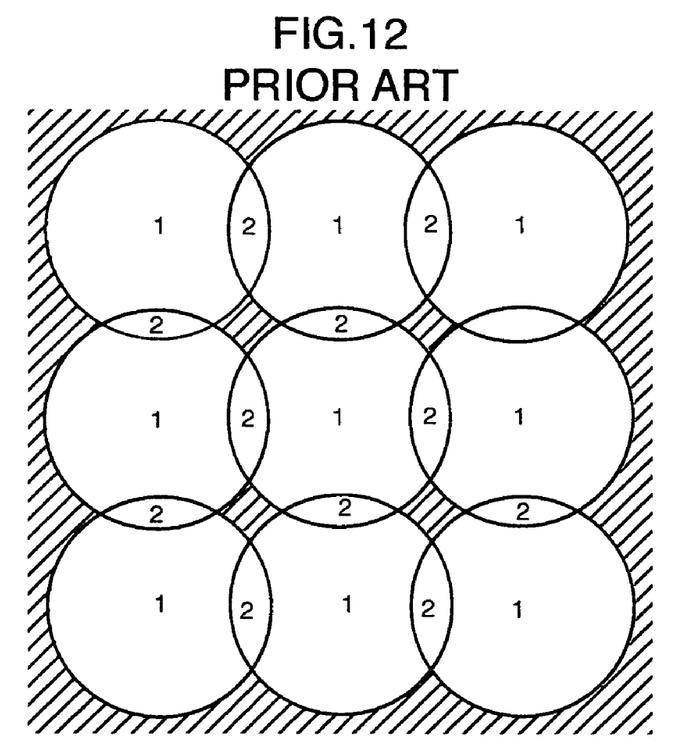
FIG. 12 illustrates an illumination pattern on a target surface at a 2.0 meter target distance of another prior art 3×3 array of LEDs.

FIGS. 11 and 12 illustrate two prior art arrangements in which off-axis orientation of the LED emitters has not been applied. The disk "spots," which typically result from positioning the LED emitters on a single plane, are merely aligned as shown in FIG. 11 or perhaps moved in slightly to overlap as shown in FIG. 12. With reference to FIGS. 11 and 12, the exclusionary zones are the shaded areas between the circles, representing regions receiving relatively little illumination due to the circular radiation pattern from the individual LEDs. By comparison, FIG. 9 illustrates one embodiment of the invention, a broadly illuminating, 3×3 array covering an area of approximately 2,150 in$^2$. FIG. 10 illustrates, for comparison, a 3×3 array that produces amore concentrated illumination pattern covering an area of approximately 456 in². In FIG. 9, each pair of adjacent emitter columns in a three-column array is arranged "off-axis" with respect to each other as shown in FIG. 5 of the drawings. That is, the side column LEDs 10, 12, in FIG. 5 are spaced by a predetermined distance (d2 in FIG. 4A) from the center column LEDs 14 and oriented, i.e., aimed, at an angle of $\alpha$=12.5 degrees with respect to the axis of the center column LEDs 14. This angular displacement of the side column LEDs is referred to in the present description as the "off-axis" configuration.

Referring further to FIG. 9, there is illustrated an illumination pattern at a target distance of two meters produced by an LED task light having an array of 3×3 LEDs. The three columns of LEDs each have shown three rows of LEDs. The circular patterns overlap because the spacings d2 and d1 (see FIG. 4A) are selected to provide the amounts of overlap shown in FIG. 9. FIG. 9 includes nine circular patterns. Within each region of overlap, a number indicates the number of illumination pattern "layers," that is, that number of LED light outputs are additive on the illuminated target surface. For example, in the center region of FIG. 9 is entered the numeral 9, indicating that all nine LEDs—i.e., 9 "layers" of illumination—are contributing to the illumination of the target surface in that region. Similarly, in the adjacent regions, the numeral 8 indicates that the light from eight LEDs is additive within those regions. By mathematically summing the contributions of each LED illumination disc at the target as shown in FIG. 9, the resulting average illumination is found to be approximately 5.2 lumens per unit area. With these particular column and row spacings, d2 and d1, and the off-axis emission angles of the side columns of LEDs of approximately 12.5 degrees, the LED array in FIG. 9 illuminates an area of approximately 25×25 inches at two meters for the 3×3 array, a portion of the 3×10 array shown in FIG. 4A. The overall illumination area for the 3×10 array task light of FIG. 4A would be approximately 86×25 inches or 2,150 square inches. Also note that each pair of circles or "disks" provides a region of overlap. If a third circle overlaps the overlap region of a pair of circles, a region of three "layers" results, etc.

Thus one may systematically determine the amount of illumination received by a target surface from a knowledge of the geometry of the LED array in the task light. The configuration of FIG. 9 was found by experiment to be the optimum balance between maximum brightness and the maximum useable spot size for a task light at two meters from the target. This configuration results from orienting the emission axes of the side columns of the three column array of FIGS. 1, 2 and 3 by 12.5 degrees relative to the center column of LEDs—i.e., by applying the ¼ beam-width formula. Measurements of the flux at the target confirm the results.

Referring now to FIG. 10, there is illustrated a more compact illumination pattern upon the target area or surface. This 3×3 array is smaller, having dimensions of approximately 24×19 inches for an area of 456 inches squared, provided by much smaller off-axis angles. However, the size of the region of highest illumination having 9 overlapping patterns is larger, providing a focused, spotlight illumination. As in FIG. 9, the pattern includes areas of overlap having intersections of the individual illumination patterns at the target surface. Further, as described herein above in FIG. 8, a feature may be incorporated in a task light to provide an adjustable emission plane, in which the LEDs are configured, in order to vary the emission axes of the LEDs to direct or focus the light beams as desired. For example, such a task light could be configured to provide either of the illumination patterns shown in FIGS. 9 and 10 as well as intermediate or other patterns.

Referring again to FIGS. 11 and 12, there are illustrated the illumination patterns typical of the prior art. FIG. 11 utilizes no overlap, leaving significant exclusionary regions with little or no illumination. FIG. 12 reduces these exclusionary regions by providing some overlap while maintaining approximately uniform illumination. A disadvantage of both approaches is that neither configuration provides a very bright illumination of the target because neither employs the LED emitter alignment technology disclosed herein to improve the utilization of the LED emitters to provide substantially improved disk target efficiency.

The present invention has been described herein above having several advantages. Using the disclosed off-axis emission formulation allows a designer to maximize brightness using the beam-width/target distance formula for $\alpha$, expressed in terms of emitter axis spread at the emission point. In the illustrative example described herein, the disk flux efficiency may be improved by a factor of 6.6 as compared to the nominal case—see, e.g., FIG. 11—where the same number of emitters are used and the flux circles emitted don't intersect upon the target region. This factor represents the ratio of the average illumination levels over the illuminated area of the target for the two cases. In the case of a two meter target distance (as in FIG. 9, described herein above), a 12.5 degree offset angle $\alpha$ minimizes exclusion at the target distance and provides an average illumination level of approximately 5.2 lumens per unit area. At the same distance, the average illumination level for the non-intersected case (FIG. 11) is approximately the same as the ratio of the area of a circle to the area of the square that just encloses the circle, or 0.785 lumens per unit area, taking into account the exclusion areas between the circular flux patterns 5.2 divided by 0.785 is approximately 6.6. The flux at the target related to the flux at the non-intersected disks (as in the prior art of FIG. 11) is thus almost 7 times as bright with a spot only ⅓ smaller in size as the conventional LED arrays used in the industry at the present time.

The present invention also offers advantages in the electrical drive circuit design which is employed. The present design eliminates the need for a heavy transformer by utilizing the electrical drive circuitry described. The need for batteries can also be eliminated. There is no need for voltage stabilization using the described circuits and full wave rectification is simply and easily achieved in a hand light. The number of resistors has been radically reduced over prior art designs. By simply varying the current controlling resistor, the intensity of light can be varied. The voltage in the circuit can vary from 60 to 120 times that which was allowable in prior art circuits of the same type.

While the invention has been shown in several of its embodiments to illustrate the principles of the invention, it is not limited thereby but is susceptible to various changes and modifications as have been suggested herein without departing from the spirit thereof.

We claim:

1. An array of LED emitters, comprising:
   at least first and second LED emitters having predetermined emission beam widths, disposed on a substrate, and electrically coupled together in a circuit, the LED emitters separated by a first predetermined spacing;
   wherein the emission axis of the second LED emitter is oriented at a non-zero angle relative to the emission axis of the first LED emitter that is a defined fraction of the predetermined emission beam width of an individual LED emitter.

2. The array of LED emitters of claim 1, wherein the non-zero angle is approximately one-quarter of the emission beam width of the individual LED emitter.

3. The array of LED emitters of claim 1, wherein the emission beam widths of the at least first and second LED emitters are substantially uniform.

4. The array of LED emitters of claim 1, wherein each first and second LED emitter defines a row of LED emitters separated by the first predetermined spacing and the LED emitters of each row are oriented such their respective emission axes are parallel.

5. The array of LED emitters of claim 4, wherein the LED emitters in each row are separated by a second predetermined spacing.

6. An LED task light having a light source comprising: an array of LED emitters configured according to claim 1.

* * * * *